United States Patent [19]
Hong

[11] Patent Number: 5,674,760
[45] Date of Patent: Oct. 7, 1997

[54] METHOD OF FORMING ISOLATION REGIONS IN A MOS TRANSISTOR DEVICE

[75] Inventor: Gary Hong, Hsinchu, Taiwan

[73] Assignee: United Microelectronics Corporation, Hsinchu, Taiwan

[21] Appl. No.: 607,120

[22] Filed: Feb. 26, 1996

[51] Int. Cl.$^6$ .................... H01L 21/336; H01L 21/8238
[52] U.S. Cl. .................... 437/24; 437/26; 437/56
[58] Field of Search .................... 437/24, 26, 56

[56] References Cited

U.S. PATENT DOCUMENTS 4,700,454  10/1987  Baerg et al. .................... 437/24

FOREIGN PATENT DOCUMENTS 3726842  2/1988  Germany .................... 437/24
59-55068  3/1984  Japan .................... 437/56

*Primary Examiner*—Chandra Chaudhari
*Assistant Examiner*—Toniae M. Thomas
*Attorney, Agent, or Firm*—Fish & Richardson P.C.

[57] ABSTRACT

The present invention is directed to a MOS transistor and its method of fabrication. The transistor includes isolating layers below source/drain regions of the transistor. In this manner, lateral diffusion occurring in the source/drain regions can be retarded. Accordingly, the fabricated. MOS transistor has the advantages of shallow junction depth, low junction capacitance, and better punchthrough resistance. Furthermore, since the bulk of the MOS transistor might be connected to a constant voltage, most likely ground, via a contact region, the floating body effects typically encountered in SOI (silicon-on-insulator) devices can be avoided.

6 Claims, 5 Drawing Sheets

METHOD OF FORMING ISOLATION REGIONS IN A MOS TRANSISTOR DEVICE

BACKGROUND OF THE INVENTION

1. Field of the Invention

The present invention generally relates to a semiconductor device. More particularly, the present invention relates to a metal-oxide-semiconductor (MOS) transistor and a method for fabricating the same, which has the advantages of shallow junction depth, low junction capacitance, and better punchthrough resistance.

2. Description of the Related Art

Referring to FIGS. 1A–1D, the cross-sectional views of a conventional method for fabricating a MOS transistor are depicted in sequence. As shown in FIG. 1A, a semiconductor substrate 1, such as a P-type silicon wafer, is first provided. A gate oxide layer 100 and a doped polysilicon layer 102 are thereafter subsequently deposited and patterned to constitute a stacked gate 10 on the semiconductor substrate 1.

Next, as shown in FIG. 1B, the substrate 1 is subjected to an ion implantation procedure, that is, N-type impurities (e.g., $As^+$) are implanted into the substrate 1 to form a pair of lightly-doped regions 12, designated as $N^-$, by utilizing the stacked gate 10 as a mask. Afterwards, sidewall spacers 120 are formed on sidewalls of the stacked gate 10 as depicted in FIG. 1C. Usually, the sidewall spacers 12 are formed by a process wherein an oxide layer is CVD-deposited and then etched back.

Finally, the substrate 1 is subjected to another ion implantation procedure to form a pair of heavily-doped regions 14 that come into contact with the lightly-doped regions 12, respectively, using the stacked gate 10 and the sidewall spacers 120 as masking. Since the implanted impurities in this step are also N-type ions but width an energy and dosage greater than those in above-mentioned step, the heavily-doped regions 14 are designated as $N^+$ for differentiation as depicted in FIG. 1D.

However, as a result of the trend toward miniaturization, the channel length between source/drain regions is growing smaller and smaller. Accordingly, the depletion regions induced near the source/drain junctions are apt to come into contact with each other resulting in a short-channel effect, such as punchthrough. Moreover, the lightly-doped regions will degrade the overall performance of the device due to the resistance of the lightly-doped regions being higher than that of the heavily-doped regions.

SUMMARY OF THE INVENTION

Therefore, it is an object of the present invention to provide a metal-oxide-semiconductor (MOS) transistor and its method of fabrication, which has advantages of shallow junction depth, low junction capacitance, and better punchthrough resistance.

The present invention achieves the above-identified object by providing a Method for fabricating a MOS transistor, comprising: providing a silicon substrate of a first conductivity type; forming field oxides on the substrate to define an active region therebetween; subsequently forming a gate dielectric layer and then a conducting layer over the substrate; forming a shielding layer on the conducting layer; patterning the conducting layer to form a gate electrode by utilizing the shielding layer as masking; implanting isolating impurities into the substrate through the shielding layer as a mask and reacting the isolating impurities to form two isolating layers within the substrate; and implanting impurities of a second conductivity type into the substrate to form source/drain regions deposed above the isolating layers.

Furthermore, the present invention achieves the above-identified object by providing a MOS transistor, comprising: a silicon substrate having field oxides formed thereon to define an active region therebetween; a gate dielectric layer formed on the active region; a gate electrode formed on the gate dielectric layer; a pair of isolating layers formed within the substrate of the active region at opposite sides of the gate; and source/drain regions formed in the substrate above respective ones of the isolating layers.

BRIEF DESCRIPTION OF THE DRAWINGS

Other objects, features, and advantages of the present invention will become apparent by way of the following detailed description of the preferred but non-limiting embodiments. The description is made with reference to the accompanying drawings.

DETAILED DESCRIPTION OF THE PREFERRED EMBODIMENT

Referring to FIGS. 2A–2G, the process flow of one preferred embodiment according to the present invention is depicted. The present invention is suitable for a semiconductor substrate 2 of a first conductivity type (e.g., an N-type or P-type silicon wafer). This exemplary embodiment uses a P-type silicon substrate to fabricate an NMOS transistor. The method in accordance with the present invention is described in detail as follows.

STEP 1

Figure 1A:
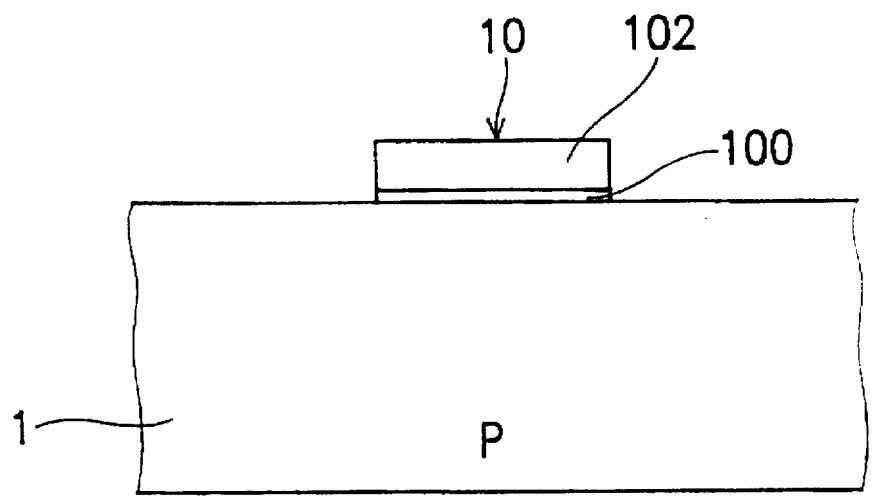
FIGS. 1A–1D depict the process flow of a conventional method for fabricating a MOS transistor in cross-sectional views.
Figure 1B:
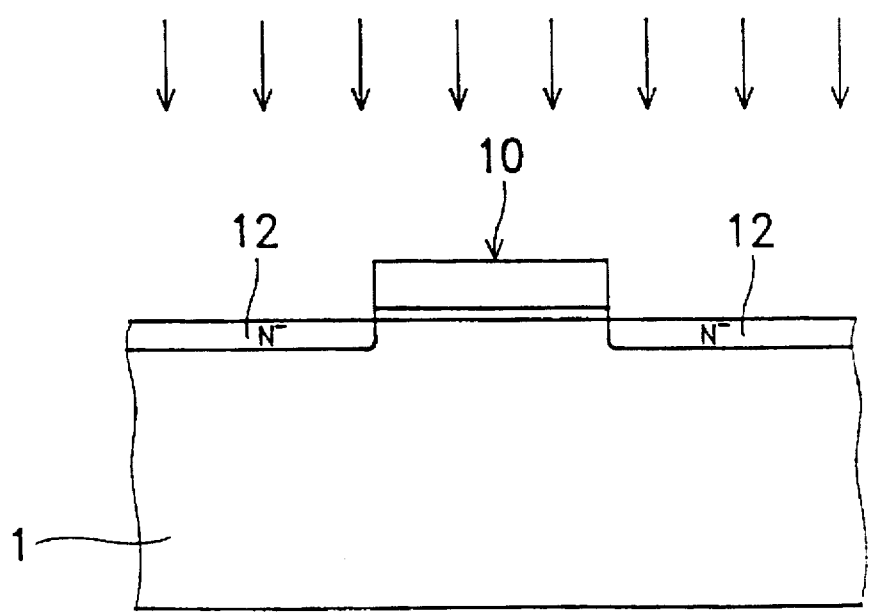
Figure 1C:
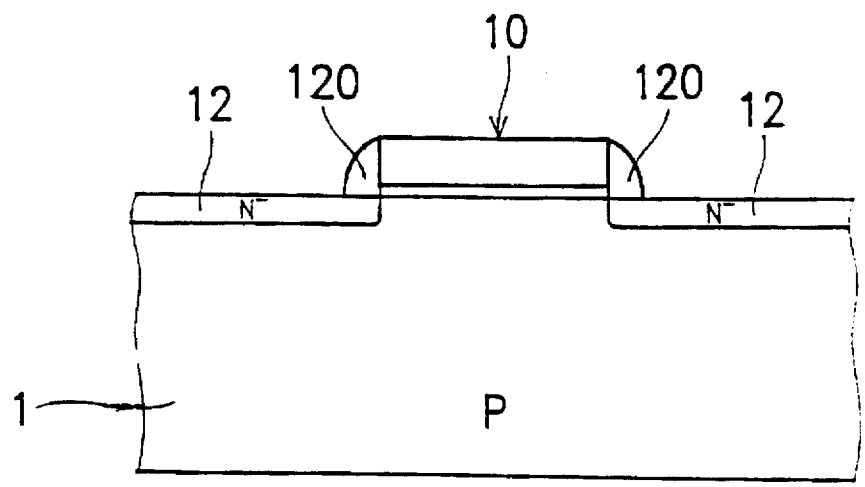
Figure 1D:
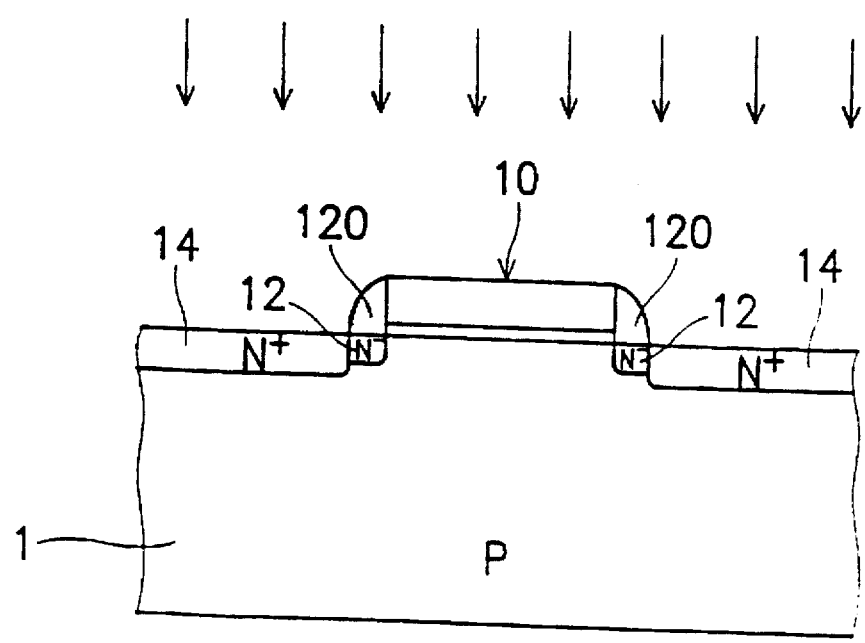
Figure 2A:
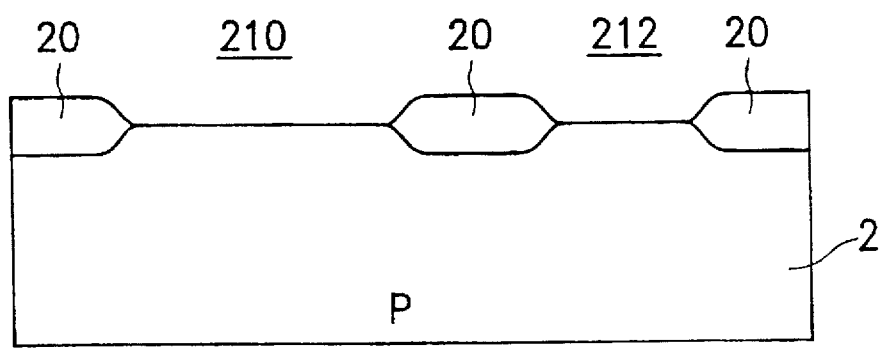
FIGS. 2A–2G depict the process flow of one preferred embodiment according to the present invention in cross sectional views.

As shown in FIG. 2A, field oxides 20 are first thermally grown on the substrate 2 to define a first active region 210 and a second active region 212. The first active region 210 is the region for fabricating a MOS transistor therein, and the second active region is the region for forming a contact region. Preferably, the field oxides 20 are formed through a procedure called LOCOS, i.e., local oxidation of silicon.

STEP 2

Figure 2B:
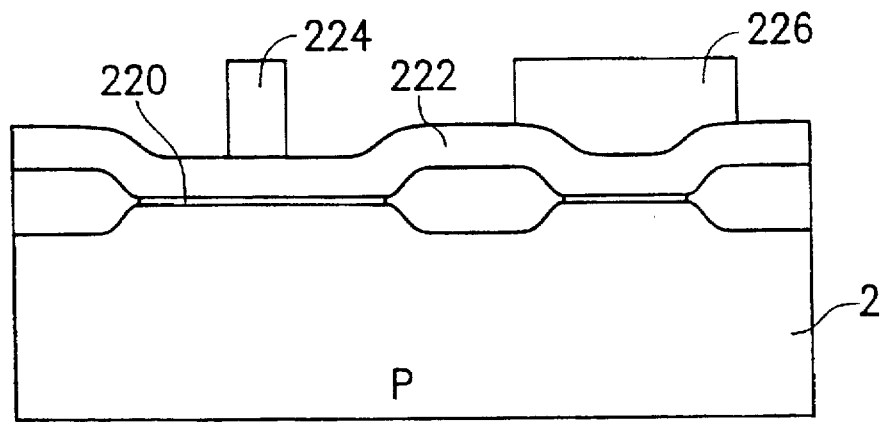

Subsequently, as shown in FIG. 2B, a gate dielectric layer 220 and a conducting layer 222 are formed over the substrate 2. Shielding layers 224 and 226 are thereafter formed on the conducting layer 222, wherein the shielding layer 226 covers the second active region 212.

For example, thermal oxidation is conducted on the surface of the semiconductor substrate 2 not covered by the field oxides 20 to form the gate dielectric layer 220. Preferably, the gate dielectric layer 220 has a thickness of about 40 Å to about 150 Å. Then, a doped polysilicon layer or a tungsten silicide layer ($WSi_2$) is deposited on the field oxides 20 as well as the gate dielectric layer 220 to form a conducting layer 222. Furthermore, the shielding layers 224 and 226 can be formed and patterned from the same photoresist layer through photolithography.

STEP 3

Figure 2C:
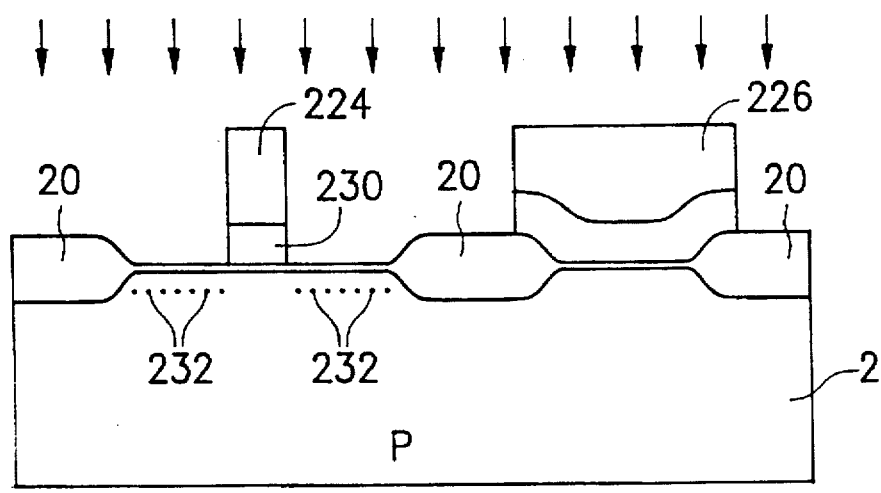
Figure 2D:
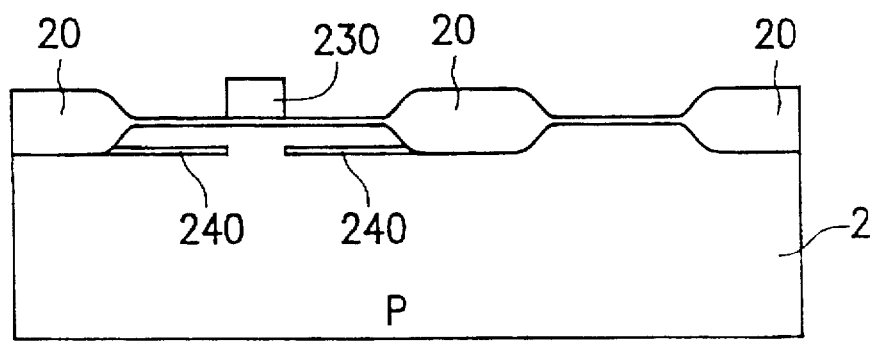

As shown in FIG. 2C, by utilizing the shielding layer 224 as a mask, the conducting layer 222 is patterned to form a gate electrode 230 by dry etching. Afterwards, isolating impurities 232 are implanted into the substrate 2 within the active region 210 using the shielding layers 224,226 and the field oxides 20 as masking. After the implanted impurities react with silicon contained in the substrate 2, a pair of isolating layers 240 are formed to a predetermined depth within regions of the substrate 2 and located at opposite sides of the gate electrode 230 as depicted in FIG. 2D.

Preferably, the isolating impurities 232 are either oxygen or nitrogen implanted at an energy of from about 30 KeV to about 100 KeV and a dosage of from about $1 \times 10^{17}$ cm$^{-2}$ to about $1 \times 10^{19}$ cm$^{-2}$ to a depth of from about 0.05 µm to about 0.5 µm. An annealing treatment is thereafter conducted to make the isolating impurities 232 react with silicon to form the isolating layers 240 of silicon oxide or silicon nitride by utilizing oxygen or nitride ions, respectively. Then, the shielding layers 224,226 are removed. The cross-sectional structure is depicted in FIG. 2D.

STEP 4

Figure 2E:
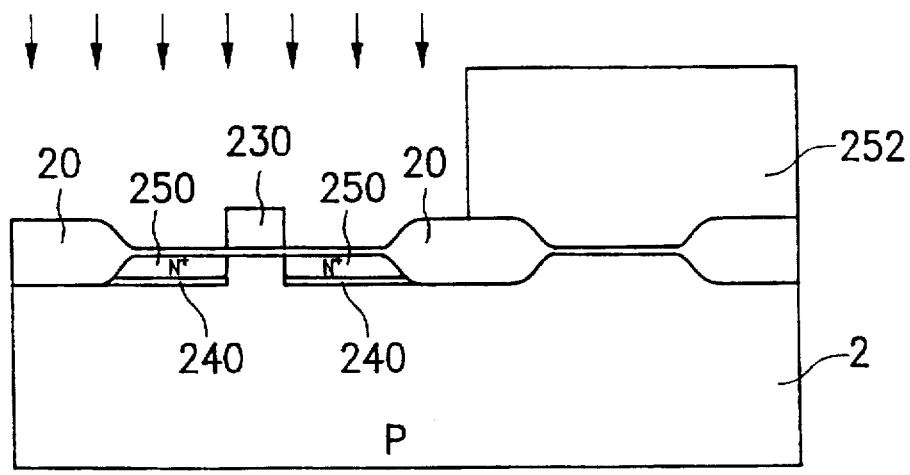

As shown in FIG. 2E, a photoresist layer 252 is formed to cover the second active region 212. Using the gate electrode 230, the field oxides 20, and the photoresist layer 252 as masking, impurities of a second conductivity type are implanted into the substrate 2 to form source/drain regions 250 within the first active region 210. Note that the source/drain regions 250 are disposed within regions confined between the gate dielectric layer 220 and the isolating layer 240. In this embodiment, the implanted impurities of the second conductivity type are N-type ions, such as As$^+$. Conversely, the implanted impurities of the second conductivity type are P-type ions if the substrate 2 demonstrates N-type conductivity. The photoresist 252 is thereafter removed.

STEP 5

Figure 2F:
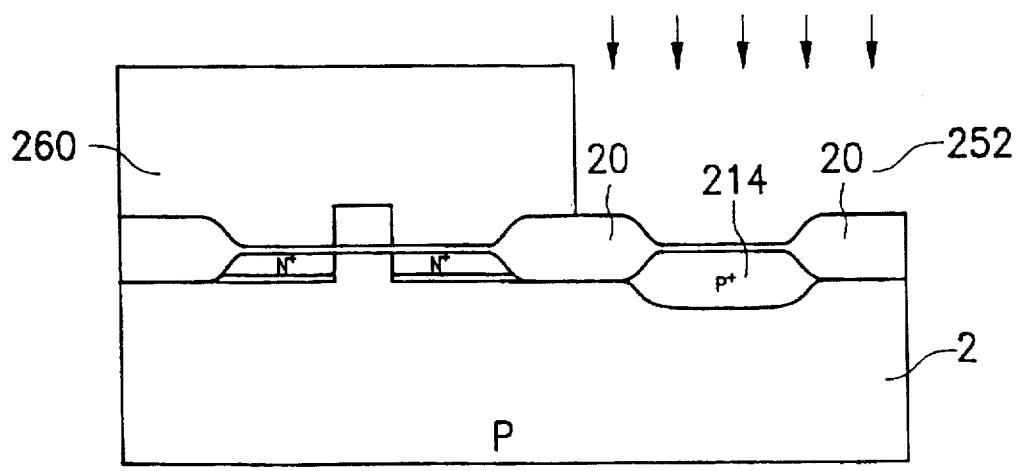

As shown in FIG. 2F, another photoresist layer 260 is formed to cover the first active region 210. After that, impurities of the first conductivity type are implanted into the substrate 2 within the second active region 212 to form a contact region 214. In the drawing, the implanted impurities are P-type ions to form a P-type contact region 214, designated as P$^+$. The photoresist layer 260 is thereafter removed.

STEP 6

Figure 2G:
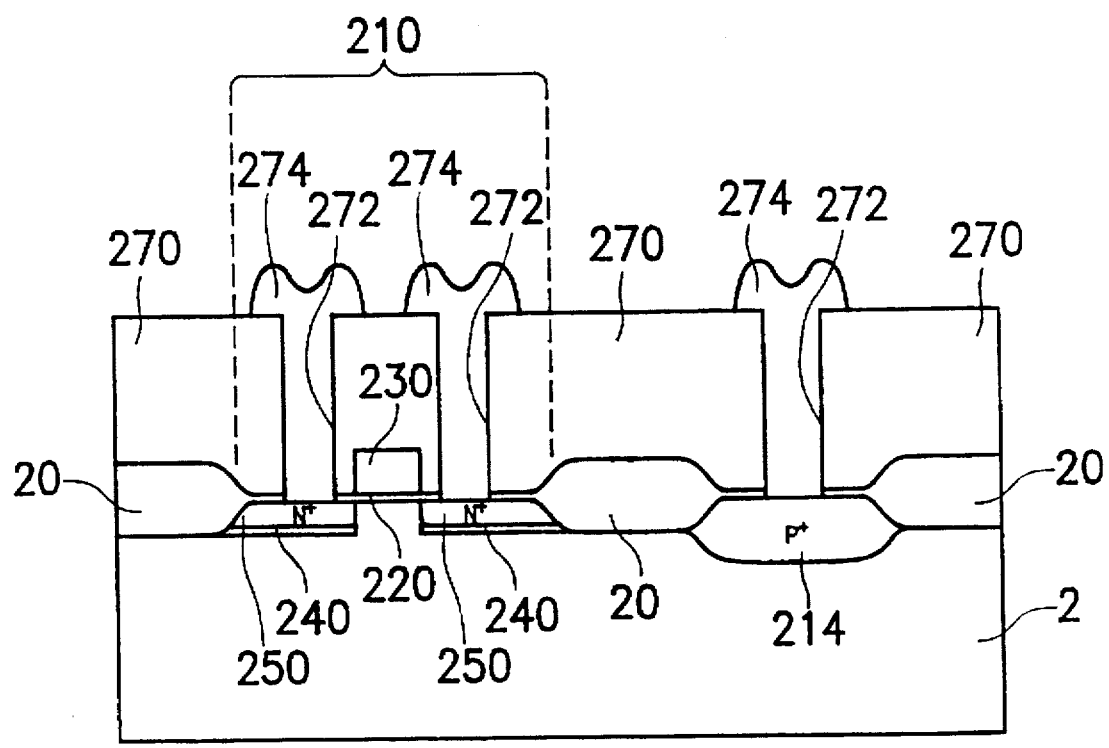

As shown in FIG. 2G, a borophosphosilicate glass (BPSG) layer 270 is deposited on the overall surface of the device and then etched to form three contact windows 272 to expose two source and drain regions 250 and contact region 214, respectively. Afterwards, a metal layer is sputtered on the BPSG layer 270 and connected to the source and drain regions 250 and the contact region 214 via the corresponding contact windows 272. After patterning and etching the metal layer, three metal contacts 274 are formed to connect to the source and drain regions and the contact region 214.

STRUCTURE

As depicted in FIG. 2G, a MOS transistor, in accordance with the present invention, comprises: a silicon substrate 2, a gate dielectric layer 220, a gate electrode 230, two isolating layers 240, and two doped regions 250. The conductivity type of the silicon substrate 2 may be either N-type or P-type. In this embodiment, a P-type silicon substrate is exemplified, which has field oxides 20 formed thereon to define an active region 210 therebetween. The gate dielectric layer 220 is formed on the substrate 2 not covered by the field oxides 20. The gate electrode 230 is formed on the gate dielectric layer 220 within the active region 210. Moreover, the isolating layers 240 are formed to a predetermined depth within the substrate 2 at opposite sides of the gate electrode 230. Those doped regions 250 formed in the substrate 2 above those isolating layers 240, respectively, serve as the source and drain regions of the MOS transistor.

In conclusion, the present invention, a MOS transistor and its method of fabrication, is provided with two isolating layers below a pair of source and drain regions, respectively. In this way lateral diffusion occurring in the source and drain regions can be retarded. Accordingly, the fabricated MOS transistor has the advantages of shallow junction depth, low junction capacitance, and better punchthrough resistance. Furthermore, since the bulk of the MOS transistor may be connected to a constant voltage, most likely ground, via a contact region, the floating body effect encountered with SOI (silicon-on-insulator) devices will not occur.

What is claimed is:

1. A method for fabricating a MOS transistor, comprising:
   providing a silicon substrate of a first conductivity type;
   forming field oxides on said substrate to define an active region therebetween;
   subsequently forming a gate dielectric layer over said substrate;
   forming a conducting layer over said gate dielectric layer;
   forming a shielding layer on said conducting layer;
   patterning said conducting layer to form a gate electrode by utilizing said shielding layer as a masking layer;
   implanting isolating impurities into said substrate using said shielding layer and reacting said isolating impurities to form two isolating layers within said substrate at opposite sides of said gate electrode;
   implanting impurities of a second conductivity type, different than said first conductivity type, into said substrate to form a pair of source and drain regions disposed above respective regions of said isolating layers; and
   implanting impurities of the first conductivity type into said substrate outside said active region to form a contact region said contact region formed after forming said pair of source and drain regions.

2. The method as claimed in claim 1, wherein said isolating impurities are oxygen.

3. The method as claimed in claim 1, wherein said isolating impurities are nitrogen.

4. The method as claimed in claim 1, wherein said shielding layer is a photoresist layer patterned by photolithography.

5. The method as claimed in claim 1, wherein said first conductivity type is P-type, and the second conductivity type is N-type.

6. The method as claimed in claim 1, wherein said first conductivity type is N-type, and said second conductivity type is P-type.

* * * * *